(12) United States Patent
Nguyen et al.

(10) Patent No.: US 12,543,572 B2
(45) Date of Patent: Feb. 3, 2026

(54) SEMICONDUCTOR SYSTEMS WITH ANTI-WARPAGE MECHANISMS AND ASSOCIATED SYSTEMS, DEVICES, AND METHODS

(71) Applicant: Micron Technology, Inc., Boise, ID (US)

(72) Inventors: Quang Nguyen, Boise, ID (US); Christopher Glancey, Boise, ID (US); Koustav Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 787 days.

(21) Appl. No.: 17/691,017

(22) Filed: Mar. 9, 2022

(65) Prior Publication Data
US 2023/0290738 A1    Sep. 14, 2023

(51) Int. Cl.
*H01L 23/00* (2006.01)
*H01L 21/48* (2006.01)
*H01L 25/065* (2023.01)

(52) U.S. Cl.
CPC ........ *H01L 23/562* (2013.01); *H01L 21/4853* (2013.01); *H01L 24/16* (2013.01); *H01L 25/0655* (2013.01); *H01L 2224/16227* (2013.01); *H01L 2924/1434* (2013.01); *H01L 2924/172* (2013.01); *H01L 2924/17724* (2013.01); *H01L 2924/17747* (2013.01); *H01L 2924/3511* (2013.01)

(58) Field of Classification Search
CPC ... H01L 23/562; H01L 21/4853; H01L 24/16; H01L 25/0655; H01L 2224/16227; H01L 2924/1434; H01L 2924/172; H01L 2924/17724; H01L 2924/17747; H01L 2924/3511; H01L 23/585; H01L 25/18; H01L 23/16

See application file for complete search history.

(56) References Cited

U.S. PATENT DOCUMENTS

| 2009/0115048 A1* | 5/2009 | Zhao ................... H01L 23/24 257/690 |
| 2014/0302641 A1* | 10/2014 | Muniandy ............. H01L 24/19 438/113 |
| 2015/0008571 A1* | 1/2015 | Gallegos ............... H01L 24/83 257/690 |
| 2018/0151461 A1* | 5/2018 | Cho .................. H01L 23/49822 |
| 2019/0043771 A1* | 2/2019 | Chang ................ H01L 23/04 |
| 2020/0075545 A1* | 3/2020 | Kim ...................... H01L 25/50 |
| 2021/0193538 A1* | 6/2021 | Huang ............... H01L 25/0655 |

(Continued)

*Primary Examiner* — Jeff W Natalini
*Assistant Examiner* — Rose Keagy
(74) *Attorney, Agent, or Firm* — Dorsey & Whitney LLP

(57) ABSTRACT

Semiconductor systems having anti-warpage frames (and associated systems, devices, and methods) are described herein. In one embodiment, a semiconductor system includes (a) a printed circuit board (PCB) having a first side and a second side opposite the first side, and (b) at least one memory device attached to the PCB at the first side of the PCB. The semiconductor system further includes a frame structure attached to the PCB at the first side of the PCB and proximate the at least one memory device. The frame structure can be configured to resist warpage of the PCB, for example, when the semiconductor system is heated to attach the at least one memory device to the PCB.

20 Claims, 4 Drawing Sheets

(56) References Cited

U.S. PATENT DOCUMENTS

| | | | |
|---|---|---|---|
| 2022/0189844 A1* | 6/2022 | Hung | H01L 25/03 |
| 2022/0270909 A1* | 8/2022 | Graf | H01L 23/49822 |
| 2022/0359422 A1* | 11/2022 | Lin | H01L 23/10 |

* cited by examiner

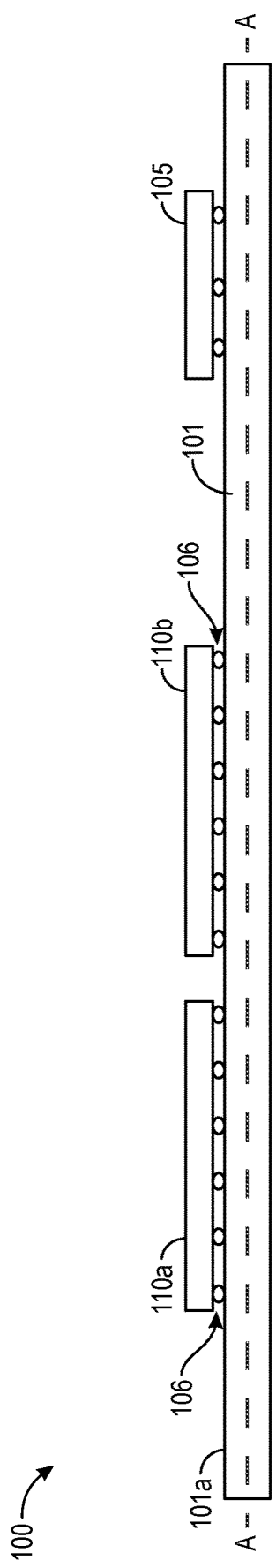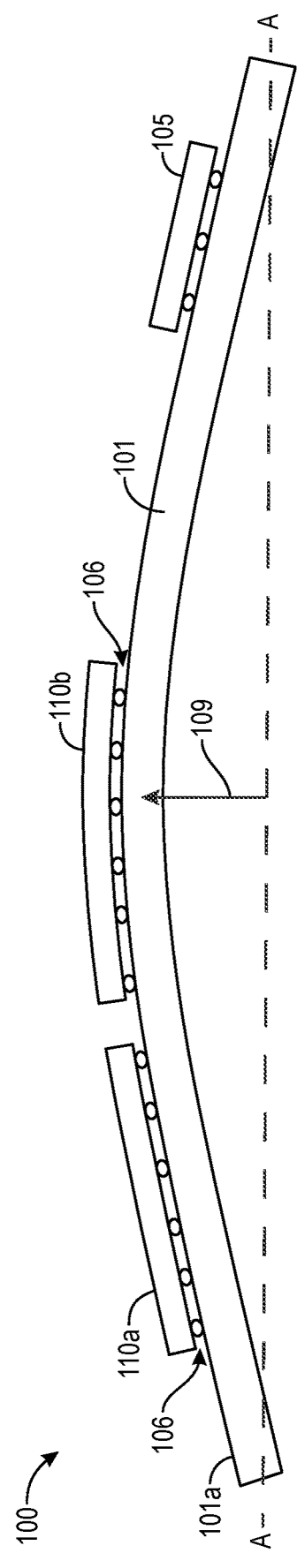

US 12,543,572 B2

SEMICONDUCTOR SYSTEMS WITH ANTI-WARPAGE MECHANISMS AND ASSOCIATED SYSTEMS, DEVICES, AND METHODS

TECHNICAL FIELD

The present disclosure is related to semiconductor systems, devices, and associated methods. For example, several embodiments of the present technology are directed to semiconductor systems that include mechanisms about semiconductor packages on circuit substrates.

BACKGROUND

Semiconductor devices (e.g., memory devices) are widely used to store information related to various electronic devices such as computers, wireless communication devices, cameras, digital displays, and the like. Semiconductor devices are frequently provided as internal, integrated circuits and/or as a part of external removable devices in computers or other electronic devices. Using memory as an example, the semiconductor devices may be used in many different types of memory, including volatile and non-volatile memory. Volatile memory, including static random-access memory (SRAM), dynamic random-access memory (DRAM), and synchronous dynamic random-access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase-change memory (PCM), ferroelectric random-access memory (FeRAM), resistive random-access memory (RRAM), and magnetic random-access memory (MRAM), among others. Improving semiconductor devices, generally, may include increasing circuit density, increasing performance (e.g., read/write) speeds or otherwise reducing operational latency, increasing reliability, increasing performance retention, reducing power consumption, reducing manufacturing costs, or reducing dimensional attributes, among other metrics.

BRIEF DESCRIPTION OF THE DRAWINGS

The disclosure will be understood more fully from the detailed description given below and from the accompanying drawings of various embodiments of the disclosure. The components in the drawings are not necessarily to scale. Instead, emphasis is placed on illustrating clearly the principles of the present technology. The drawings should not be taken to limit the disclosure to the specific embodiments illustrated, but are for explanation and understanding only.

FIG. 1A is a partially schematic side view of a memory system.

FIG. 1B is a partially schematic side view of the memory system of FIG. 1A with warpage.

DETAILED DESCRIPTION

Figure 2A:
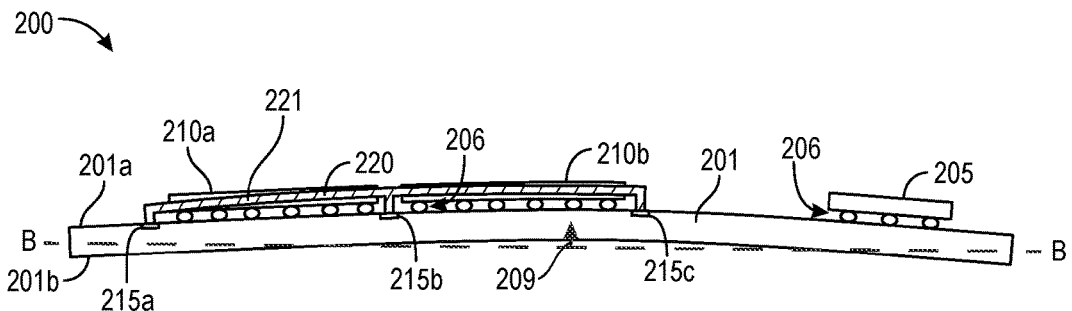
FIG. 2A is a partially schematic side view of a semiconductor system configured in accordance with various embodiments of the present technology.

As discussed in greater detail below, the technology disclosed herein relates to semiconductor systems (and associated systems, devices, and methods) that include mechanisms such as frames around (e.g., about, proximate, surrounding, tracing) semiconductor packages on substrates (e.g., printed circuit boards (PCBs)) to reduce warpage of the systems/substrates. For example, several embodiments of the present technology are directed to memory systems that include frames around memory packages on PCBs to reduce warpage of the PCBs that can occur when the systems are subjected to heating and cooling during an assembly process (e.g., to attach the memory packages to the PCBs). It is understood that the present technology can be directed to other semiconductor systems and/or substrates that incorporate heating and cooling during manufacturing or other processes.

In the illustrated embodiments below, the memory device packages are primarily described in the context of solid-state drive (SSD) memory devices incorporating NAND-based storage media, such as NAND-flash or FRAM. Memory device packages configured in accordance with other embodiments of the present technology, however, can include other types of non-volatile memory devices and/or storage media (e.g., MRAM, PCM, or RRAM), including storage media that are not NAND-based (e.g., NOR-based) or are only partially NAND-based. Moreover, memory device packages configured in accordance with still other embodiments of the present technology can include volatile memories devices and/or storage media, such as DRAM devices and/or SRAM devices. A person skilled in the art will understand that the technology may have additional embodiments and that the technology may be practiced without several of the details of the embodiments described below with reference to FIGS. 1-5.

As used herein, the terms "vertical," "lateral," "upper," "top," "lower," "bottom," "above," "over," and "below" can refer to relative directions or positions of features in the semiconductor systems in view of the orientation shown in FIGS. 1-5. For example, "top" can refer to a feature positioned closer to the top of a page than another feature. These terms, however, should be construed broadly to include semiconductor systems having other orientations, such as inverted or inclined orientations where top/bottom, over/under, above/below, up/down, and left/right can be interchanged depending on the orientation.

A. Overview

Many semiconductor systems are assembled by attaching one or more semiconductor devices, packages and/or other components to a PCB. For example, FIGS. 1A and 1B illustrate an example memory system 100 ("the system 100") having two memory device packages 110 (identified individually as memory device package 110a ("memory device 110a") and memory device package 110b ("memory device 110b") in FIGS. 1A and 1B) and a controller 105 attached to a top surface 101a of a PCB 101. To attach the memory devices 110a, 110b to the PCB 101, solder 106 is commonly (i) positioned between the PCB 101 and the memory devices 110a, 110b; (ii) reflowed at high temperatures (e.g., around 220° C.); and (iii) subsequently allowed to resolidify (e.g., as the system 100 is allowed to cool and return to room temperature, or around 20° C.). As the solder resolidifies, the solder 106 forms connections (e.g., electrical connections) between the memory devices 110a, 110b and components of the PCB 101 that can hold or attach the memory devices 110a, 110b to the PCB 101.

The memory devices 110a, 110b and the PCB 101 of the system 100 often include different compositions from one another. For example, the memory devices 110a, 110b typically have low coefficients of thermal expansion (CTEs) (e.g., 5-15 ppm/° C.) due to presence of silicon (having a CTE of approximately 2-3 ppm/° C.). Continuing with this example, the PCB 101 may be composed of metal, polymer, and/or glass fiber and typically has a higher effective CTE (e.g., 12-20 ppm/° C., such as 14-20 ppm/° C.). Therefore, it is not uncommon for the memory devices 110a, 110b to have a different (e.g., a significantly lower) coefficient of thermal expansion (CTE) than the PCB 101. Thus, when the system 100 heats up (e.g., as part of the process to reflow solder during assembly to attach the memory devices 110a, 110b to the PCB 101) and/or cools down (e.g., after reflowing solder during assembly of the system 100), the memory devices 110a, 110b and the PCB 101 can disproportionally expand or contract relative to one another. This can lead to warpage 109 of the PCB 101 (illustrated as a deviation of the PCB 101 from line A-A in FIG. 1B) that can increase the overall height of the memory system 100 and/or can cause various problems within the system 100, such as cracks in the solder, poor solder joint formation, substrate cracks, and/or failures in the memory devices 110a, 110b (such as die or trace cracking in substrates). These problems can cause reliability and/or quality of services (QoS) issues because they can prevent the system 100 from functioning as intended and/or can shorten the life of the system 100.

To address these concerns, the present technology is generally directed to semiconductor systems (and associated systems, devices, and methods) that include frames or other rigid structures attached to the PCBs about one or more semiconductor devices or packages of the semiconductor systems. The frames can be formed from one or more materials (e.g., copper or aluminum) that resist warping at least at the temperatures commonly experienced by the semiconductor systems during assembly or operation. As such, when semiconductor systems of the present technology heat up (e.g., as part of the assembly process to reflow solder) or cool down (e.g., after reflowing solder during assembly of the systems), overall warpage of the semiconductor systems (e.g., caused by a disparity between the CTEs of the memory devices and the CTEs of the PCBs) can be reduced, minimized, and/or eliminated. In comparison to other semiconductor systems, the reduction in warpage achieved in semiconductor systems of the present technology can lead (a) to a reduction in the occurrence of cracks in the solder, solder connection failures, die cracks, and/or other problems within the semiconductor systems of the present technology; (b) to an increase in the reliability, QoS, and/or life of the semiconductor systems of the present technology; and/or (c) to an increase in the overall flatness (e.g., a reduction in the overall heights) of the semiconductor systems of the present technology.

Furthermore, in some embodiments, the frames can be attached to purely mechanical pads on the PCBs and/or grown out of the PCBs at the time the PCBs are fabricated. Therefore, incorporating such frames into the memory systems can avoid redesigning PCBs or using different materials simply to accommodate the frames. As such, incorporating such frames into semiconductor systems of the present technology can be a relatively inexpensive and simple solution to warpage, especially from a PCB-fabrication perspective.

Figure 2B:
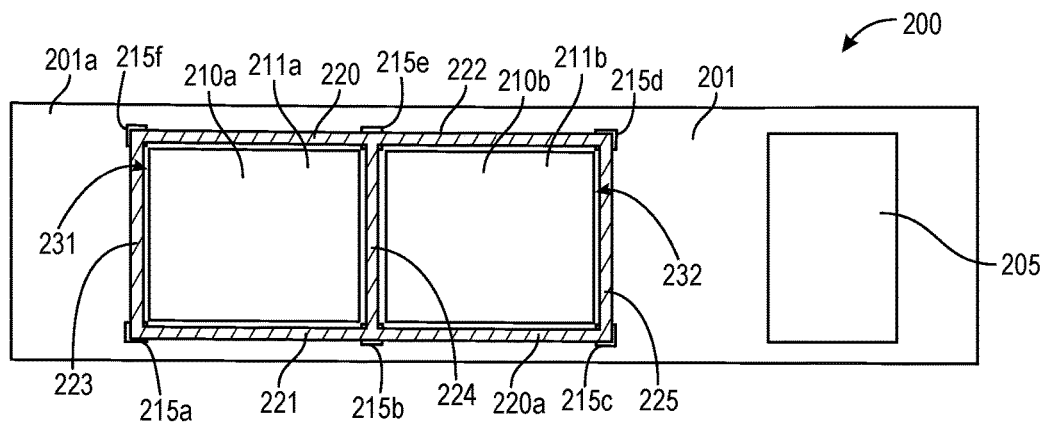
FIG. 2B is a partially schematic top view of the semiconductor system of FIG. 2A.
Figure 2C:
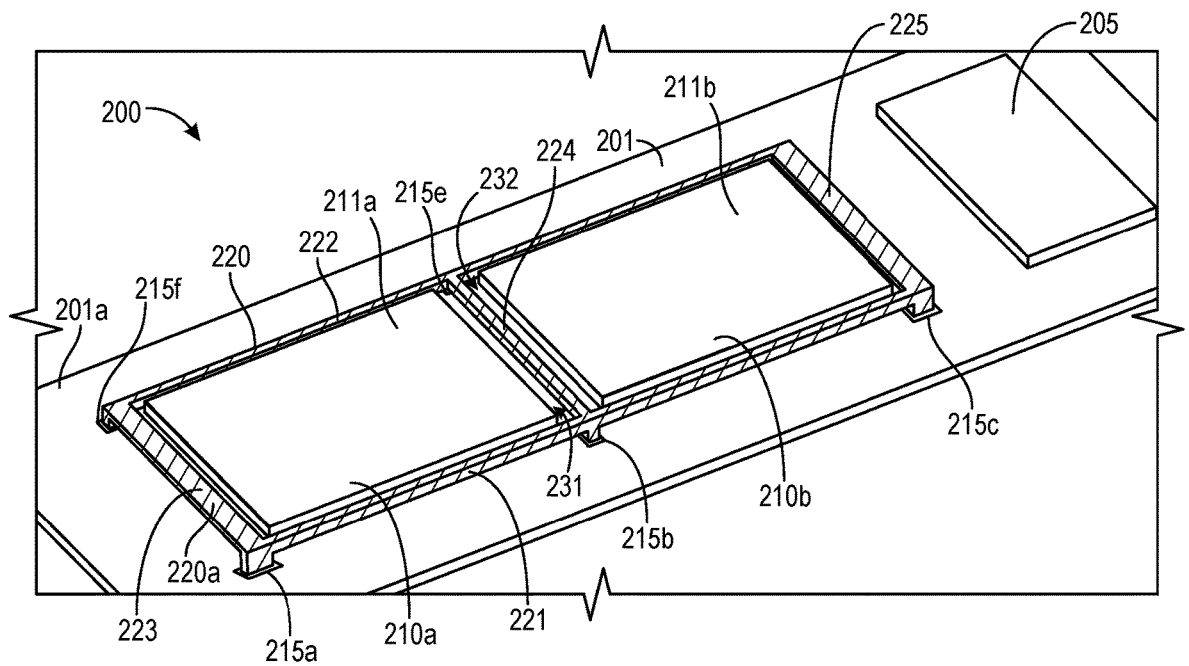
FIG. 2C is a partially schematic, partial perspective view of the semiconductor system of FIGS. 2A and 2B.

B. Selected Embodiments of Semiconductor Systems with Anti-Warpage Frames, and Associated Methods FIGS. 2A-2C are partially schematic illustrations of a semiconductor system 200 ("the system 200") configured in accordance with various embodiments of the present technology. In particular, FIG. 2A is a partially schematic side view of the system 200; FIG. 2B is a partially schematic top view of the system 200; and FIG. 2C is a partially schematic, partial perspective view of the system 200. As shown, the system 200 includes (a) a PCB 201 having a top surface (or side) 201a and a bottom surface (or side) 201b; (b) memory device packages 210 (identified individually as memory device package 210a ("the memory device 210a") and memory device package 210b ("the memory device 210b") in FIGS. 2A-2C); and (c) a controller 205 (e.g., a memory controller and/or a host device, such as an upstream central processing unit (CPU)).

In some embodiments, the system 200 can be a nonvolatile memory system, such as an SSD. For example, the memory devices 210a and/or 210b can be memory dies or packages that include NAND flash or other nonvolatile storage media. In other embodiments, the system 200 can be a volatile memory system, such as a dual in-line memory module (DIMM). For example, the memory devices 210a and/or 210b can be DRAM memory dies or packages or other volatile memory dies or packages. Although shown with two memory devices 210 in FIGS. 2A-2C, the system 200 can include a single memory device 210 or more than two memory devices 210 in other embodiments of the present technology.

The memory devices 210a, 210b can communicate with the controller 205 via the PCB 201 at least when the memory devices 210a, 210b and the controller 205 are electrically connected to the PCB 201. For example, the memory devices 210a, 210b and/or the controller 205 (a) can be coupled to electrical contacts disposed in or on the top surface 201a of the PCB 201, and/or (b) can be operably and/or electrically coupled to one another via various traces, conductive planes, vias, solder connections, conductive pillars, wires, leads, or other electrical connections (not shown) extending throughout the PCB 201. More specifically, the memory devices 210a, 210b and/or the controller 205 can be attached to the electrical contacts at the top surface 201a of the PCB 201 via solder 206 in accordance with the discussion above with reference to FIG. 1 or using another suitable technique.

As discussed above, a disparity between CTEs of components of the system 200 can cause warpage of the PCB 201, for example, during assembly of the system 200. To address this concern, the system 200 of FIGS. 2A-2C further includes an anti-warpage frame structure 220 ("the frame 220"). In the illustrated embodiment, the frame 220 includes (a) two elongate members 221 and 222 ((or rails) and (b) three cross members 223-225 that each connect the two elongate members 221 and 222 to one another at ends or middles of the elongate members 221 and 222. In some embodiments, the frame 220 is a continuous, unitary structure. Alternatively, the frame 220 can be formed of several individual sections that can be joined together before or during assembly of the system 200. As a specific example, the elongate member 221 and/or the elongate memory 222 can be formed of two or more smaller members that are joined together end-to-end before or during assembly of the system 200.

As shown in FIGS. 2A-2C, the frame 220 can be attached (e.g., rigidly or fixedly) to the PCB 201 at the top surface 201a of the PCB 201. For example, the frame 220 can be stiff or rigid and attached to one or more mounting pads 215 (identified individually as pads 215a-215f in FIGS. 2A-2C) or other mounting structures disposed in or on the top surface 201a of the PCB 201. The mounting pads 215 or other mounting structures can be purely mechanical contacts or structures that are electrically isolated from all other components of the PCB 201. In these embodiments, when the frame 220 is attached to the mounting pads 215 or other mounting structures, the frame 220 can be a purely mechanical structure and can also be electrically isolated from other components of the PCB 201. Stated another way, when the frame 220 is connected to only purely mechanical mounting pads 215 or other purely mechanical mounting structures of the PCB 201, the frame 220 can remain disconnected from electric potentials (e.g., power supply or ground voltages) and/or is not configured to transmit or carry an electrical signal. In other embodiments, the mounting pads 215 or other mounting structures disposed in or on the first surface 201a of the PCB 201 can be electrical contacts configured to electrically couple the frame 220 to other components of the PCB 201. In such embodiments, the frame 220 can be connected to one or more electric potentials (e.g., power supply or ground voltages) and/or can be configured to transmit or carry an electrical signal, at least when the frame 220 is connected to the PCB 201.

As best shown in FIGS. 2B and 2C, the mounting pads 215 can be disposed in or on the PCB 201 at or proximate the ends of the members 221-225. Stated another way, the mounting pads 215 can be disposed in or on the PCB 201 at or proximate ends of the elongate members 221 and 222, at points (e.g., midpoints or other points) along the lengths of the elongate members 221 and 222, and/or at or proximate corners of the memory devices 210a, 210b. Thus, when the frame 220 is attached to the PCB 201, the elongate members 221 and 222 of the frame 220 can be positioned over the top surface 201a of the PCB 201 and/or oriented such that they extend (a) in a direction generally parallel to a longer dimension of the PCB 201, (b) in a direction generally parallel to an axis of the PCB 201 along which warpage is commonly known to occur absent the frame 220, and/or (c) in a direction that extends along one of the sides of the memory devices 210a, 210b when the memory devices 210a, 210b are attached to the PCB 201. Furthermore, when the frame 220 is attached to the PCB 201, the cross members 223-225 can be positioned over the top surface 201a of the PCB 201 and/or oriented such that they extend (a) in a direction generally perpendicular to the longer dimension of the PCB 201, (b) in a direction generally perpendicular to the axis of the PCB 201 along which warpage is commonly known to occur absent the frame 220, and/or (c) in a direction that extends along one of the other sides of the memory devices 210a, 210b when the memory devices 210a, 210b are attached to the PCB 201. In other words, the frame 220 can trace or follow the general footprints or perimeters of the memory devices 210a, 210b, at least when the frame 220 and the memory devices 210a, 210b are attached to the top surface 201a of the PCB 201. Stated another way, the frame 220 can be attached to the PCB 201 such that the frame 220 is positioned about (e.g., proximate, adjacent, immediately adjacent) the memory devices 210a, 210b and generally surrounds the memory devices 210a, 210b when the memory devices 210a, 210b are attached to the PCB 201. To attach the memory devices 210a, 210b to the PCB 201, the memory devices 210a, 210b can be (a) positioned on the top surface 201a of the PCB 201 through and/or within openings 231 and 232, respectively, in a top surface 220a of the frame 220, and/or (b) attached to the PCB 201 in accordance with the discussion above with reference to FIG. 1 (or using another suitable method).

The frame 220 can be attached to the PCB 201 using any suitable method. For example, solder can be used to connect portions of the frame 220 to the mounting pads 215 or other mounting structures of the PCB 201. The solder can be similar to the solder 206 used to connect the memory devices 210a, 210b and/or the controller 205 to the PCB 201. Alternatively, the solder can have a higher melting point than the solder 206 such that the solder remains solidified during the process of attaching the memory devices 210a, 210b and/or the controller 205 to the PCB 201. In these and other embodiments, a high-temperature adhesive can be used to attach the frame 220 to the PCB 201. In these and still other embodiments, the frame 220 can be braised or diffusion bonded to the mounting pads 215 or other mounting structures.

The frame 220 can be attached to the PCB 201 before or during assembly of the system 200 (e.g., before or while attaching the memory devices 210a, 210b and/or the controller 205 to the PCB 201). In some embodiments, the frame 220 can further include vertical members or sections (e.g., feet at ends of one or more of the members 221-225, as shown in FIGS. 2A and 2C) that are oriented generally perpendicular to the top surface 201a of the PCB 201 when the frame 220 is attached to the PCB 201 and that can facilitate attaching the frame 220 to the PCB 201. As shown in FIGS. 2A and 2C, the vertical members can facilitate attaching the frame 220 to the PCB 201 such that one or more of the members 221-225 of the frame 220 are raised above, offset from, and/or do not directly contact the top surface 201a or other portions of the PCB 201. This can facilitate, for example, the memory devices 210a, 210b exhausting heat under one or more of the members 221-225 of the frame 220 and into the environment surrounding the system 200, and/or can facilitate access to the memory devices 210a, 210b through gaps between the frame 220 and the top surface 201a of the PCB 201.

Although shown in FIGS. 2A-2C with mounting pads 215 disposed in or on the PCB 201 at locations corresponding to the ends of the members 221-225 of the frame 220, the system 200 can include mounting pads 215 or other mounting structures disposed in or on the PCB 201 at other locations for connecting the frame 220 to the PCB 201. For example, the system 200 can include mounting pads 215 or other mounting structures disposed in or on the PCB 201 at any number of locations between the ends of any one or more of the members 221-225 (e.g., in addition to or in lieu of any one of more of the mounting pads 215 illustrated in FIGS. 2A-2C). Alternatively, the system 200 can include a single mounting pad 215 or other mounting structure (e.g., per one or more of the members 221-225) that corresponds to one or more of the members 221-225 of the frame 220. For example, the PCB 201 can include a single mounting pad 215 and/or other mounting structure for each of the elongated members 221 and 222. Continuing with this example, each of the mounting pads/structures can span substantially the entire length (end-to-end) of the corresponding one of the elongate members 221 and 222. This can facilitate continuously attaching the elongate members 221 and 222 of the frame 220 to the PCB 201 across substantially the entire lengths of the elongate members 221 and 222.

In some embodiments, as opposed to being attached to mounting pads 215 or other mounting contacts of the PCB 201, the frame 220 can be grown out of the PCB 201. For example, the frame 220 can be grown out of the PCB 201 during fabrication of the PCB 201 (e.g., rather than attaching the frame 220 to the PCB 201 after the PCB 201 is fabricated). Growing the frame 220 out of the PCB 201 can ensure proper connection between the frame 220 and the PCB 201 and/or can reduce the likelihood that the frame 220 becomes disconnected from the PCB 201.

As shown in FIGS. 2B and 2C, the frame 220 does not contact the memory devices 210a, 210b when the frame 220 is attached to the PCB 201. In addition, the frame 220 does not extend over or cover any portion of top surfaces 211a and 211b of the memory devices 210a and 210b, respectively. This arrangement can permit a heatsink (not shown) or other component of the system 200 to (a) be positioned (e.g., directly) over the top surfaces 211a, 211b of the memory devices 210a, 210b and/or (b) to be placed in (e.g., direct) contact with the memory devices 210a, 210b, for example, to dissipate heat. Additionally, or alternatively, this arrangement can enable the memory devices 210a, 210b to exhaust or dissipate heat into the environment surrounding the system 200. Therefore, the frame 220 in the embodiment illustrated in FIGS. 2A-2C is not configured to significantly contribute to thermal dissipation from the memory devices 210a, 210b. In other embodiments, the frame 220 (a) can be placed in contact with at least a portion of the memory device 210a and/or 210b, and/or (b) can extend over or cover all or a subset of the top surfaces 211a, 211b of the memory devices 210a, 210b.

In these and other embodiments, the frame 220 can be mounted to the PCB 201 such that the frame 220 does not extend above the maximum height of the memory devices 210a, 210b. Furthermore, the frame 220 can be dimensioned to remain fully within the footprint of the PCB 201. These constraints can ensure that overall dimensions of the system 200 are not increased when the frame 220 is attached to the PCB 201. In other embodiments, when the frame 220 is attached to the PCB 201, the frame 220 can extend above the maximum height of the memory devices 210a, 210b on the PCB 201, and/or can extend beyond the footprint of the PCB 201.

The frame 220 can be formed of one or more materials that are stiff or rigid and resist warpage, at least at temperatures at which the memory devices 210a, 210b are attached to the PCB 201 during assembly (e.g., approximately 20° C. to approximately 260° C., such as approximately 20° C. to around 220° C.) and/or at which the system 200 commonly operates. For example, the frame 220 can be composed of copper, aluminum, and/or one or more other suitable materials. The thickness of the members 221-225 of the frame 220 can depend on the amount of warpage reduction desired, with frames 220 having thicker members 221-225 (especially thicker elongate members 221 and 222) expected to reduce warpage to a greater extent than frames 220 having corresponding thinner members 221-225. As shown in FIGS. 2A-2C, each of the members 221-225 are illustrated with rectangular cross-sections. In other embodiments, a cross-section of at least one of the members 221-225 of the frame 220 can be non-rectangular and/or can differ from a cross-section of another one of the members 221-225 of the frame 220.

Figure 3B:
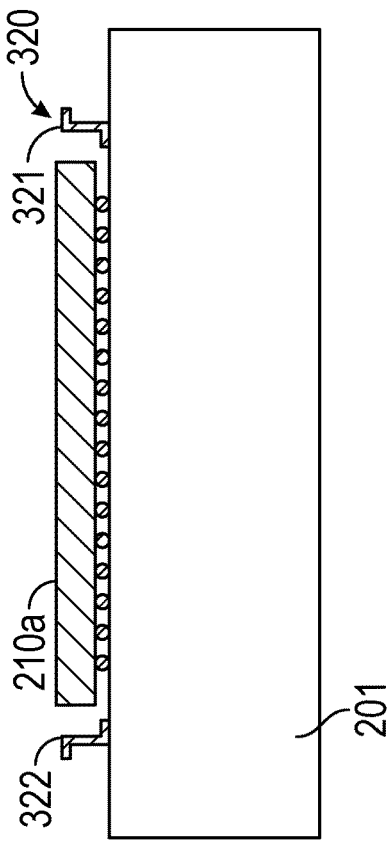
FIGS. 3A-3D are partially schematic, partial cross-sectional views of semiconductor systems configured in accordance with various embodiments of the present technology.
Figure 3D:
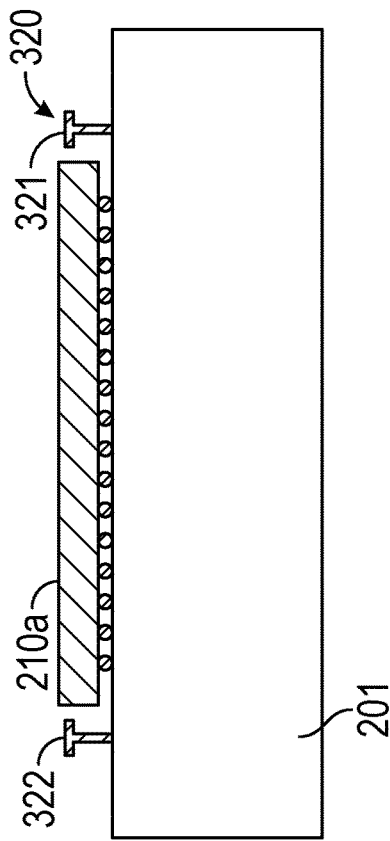
Figure 3A:
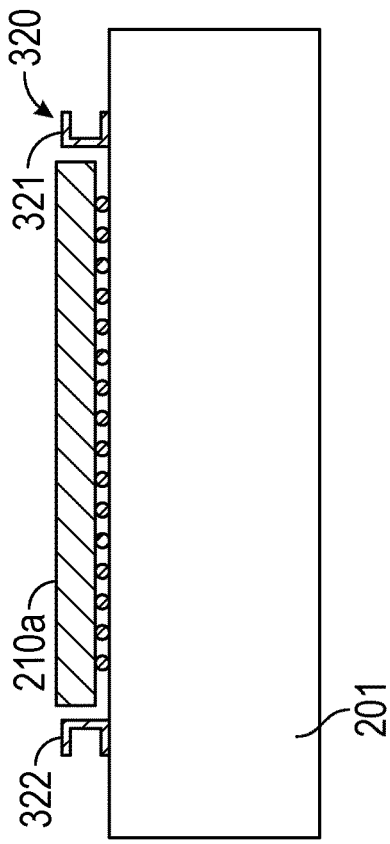
Figure 3C:
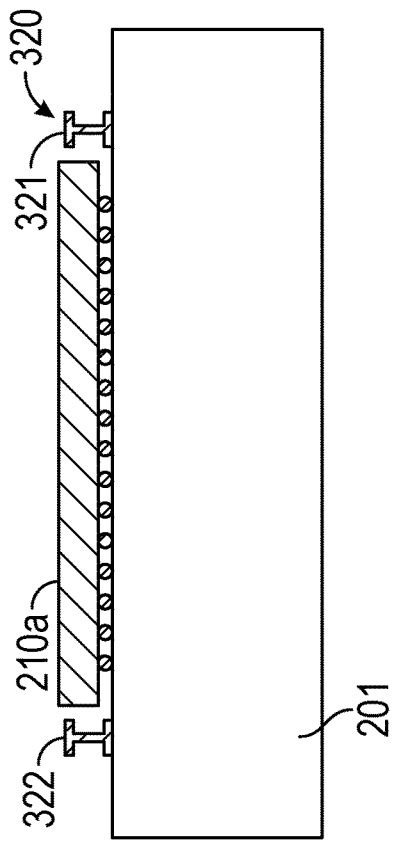

For example, FIGS. 3A-3D illustrate cross-sections of members 321, 322 of other frames 320 configured in accordance with various embodiments of the present technology. As shown, the members 321, 322 of the other frames 320 of the present technology can include 'C'-shaped or channeled cross-sections (FIG. 3A), 'Z'-shaped or channeled cross-sections (FIG. 3B), 'I'-shaped or beam-like cross-sections (FIG. 3C), or 'T'-shaped or sectioned cross-sections (FIG. 3D). Other cross-sections are of course possible and within the scope of the present technology. Furthermore, although the members 321, 322 of the frames 320 are illustrated in FIGS. 3A-3D with specific orientations, the orientations of the members 321, 322 of the frame can be different in other embodiments of the present technology. For example, although the 'C'-channels of the members 321, 322 of the frame 320 illustrated in FIG. 3A face away from the memory device 210a, the 'C'-channel of one or both of the members 321, 322 of the frame 320 can face in other directions (e.g., toward the memory device 210a, upwards away from the PCB 201, downwards toward the PCB 201) in other embodiments of the present technology. In these and other embodiments, the thicknesses or other dimensions (e.g., heights) of the members 321, 322 of the frames 320 can differ from the thicknesses or other dimensions of the members 321, 322 illustrated in FIGS. 3A-3D.

In operation, the frame 220 is configured to provide stiffness or rigidity to the PCB 201 at least during assembly of the system 200. In particular, as discussed above, when the memory devices 210a, 210b are attached the PCB 201 and the system 200 is subsequently allowed to cool, a mismatch between the CTEs of the memory devices 210a, 210b and the CTE of the PCB 201 can lead to significant warpage of the PCB 201 absent the frame 220. With the frame 220 attached to the PCB 201, however, the frame 220 resists warpage of the PCB 201, for example, while the system 200 cools (e.g., after reflowing solder to attach the memory devices 210a, 210b to the PCB 201). It is therefore expected that incorporating the frame 220 into the system 200 will lead to a significant (e.g., 20% or more) reduction in warpage 209 of the PCB 201 (the warpage 209 is illustrated as a deviation of the PCB 201 from line B-B in FIG. 2A), especially at critical areas along the PCB 201 (e.g., the locations of the memory devices 210a, 210b on the PCB 201) at which the frame 220 is attached to the PCB 201. It is also expected that varying (a) the materials used to form the frame 220, (b) the thickness of one or more of the members 221-225 of the frame 220, and/or (c) the amount of the frame 220 attached to mounting pads 215 or other mounting structures disposed in or on the PCB 201, will change the amount of warpage reduction achieved by the frame 220. Therefore, frames of the present technology are expected to facilitate producing flatter semiconductor systems in comparison to semiconductor systems lacking such frames; are expected to provide control over the amount of warpage reduction achieved; are expected to reduce the occurrence of cracks in the solder, solder connection failures, die cracks, and/or other problems within the memory systems of the present technology that can occur due to significant warpage of the PCB; and/or are expected to increase the reliability, QoS, and/or life of the semiconductor systems of the present technology. In addition, because frames of the present technology can be mounted to PCBs about memory packages, it is expected that the frames will provide an increase in physical protection (e.g., drop protection) afforded to the system 200; the memory devices 210a, 210b; and/or other critical regions of the system 200.

Although shown with members 221-225 in FIGS. 2A-2C, the frame 220 can lack one or more of the members 221-225 in other embodiments. For example, the frame 220 can lack the cross member 223, the cross member 224, and/or the cross member 225 in some embodiments (e.g., such that the elongate members 221 and 222 of the frame 220 are not connected at one or more of the ends of the elongate members 221 and 222, and/or are not connected at the middles of the elongate members 221 and 222). Additionally, or alternatively, the frame 220 can lack one or the other of the elongate members 221 and 222 such that the frame 220 includes (a) a single elongate member 221 or 222 and/or (b) one or more of the cross sections 223-225.

Furthermore, the frame 220 can include a different shape or footprint than shown in FIGS. 2A-2C in other embodiments of the present technology. For example, although the frame 220 is shown tracing the footprint or perimeter of the memory devices 210a, 210b in FIGS. 2A-2C, the frame 220 in other embodiments can extend in any direction away from the memory devices 210a, 210b and/or may not frame or generally track the perimeter of the memory devices 210a, 210b. Continuing with this example, the frame 220 can extend to, frame, and/or or generally trace the perimeter of the controller 205 or be positioned at other critical regions on the PCB 201, in addition to or in lieu of framing and being positioned about the memory devices 210a, 210b. Moreover, although shown as being attached to the PCB 201 at the top surface 201a of the PCB 201 in FIGS. 2A-2C, the frame 220 in other embodiments of the present technology can be attached to the PCB 201 at the bottom surface 201b of the PCB 201. Alternatively, the system 200 can include another frame in addition to and separate from the frame 220 (e.g., attached to the PCB 201 at the top surface 201a of the PCB 201 and about the controller 205, and/or attached to the PCB 201 at the bottom surface 201b of the PCB 201).

Figure 4:
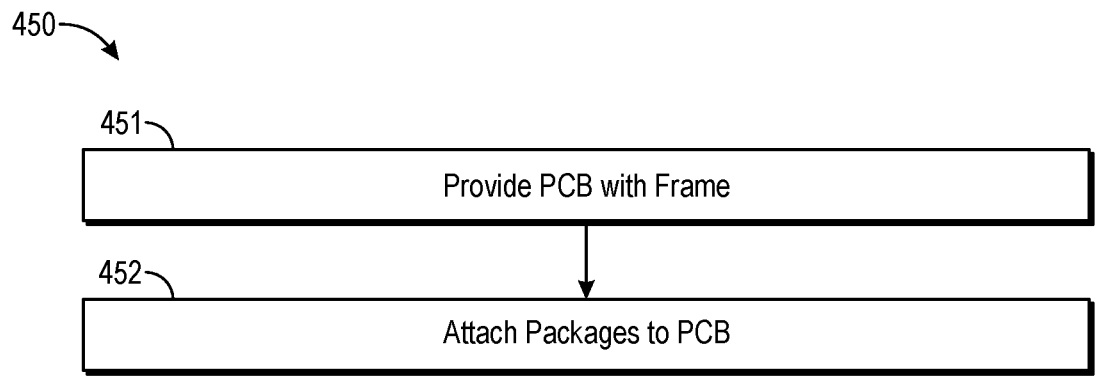
FIG. 4 is a flow diagram illustrating a method of assembling a semiconductor system in accordance with various embodiments of the present technology.

FIG. 4 is a flow diagram illustrating a method 450 of assembling a semiconductor system (e.g., the system 200 of FIGS. 2A-2C) in accordance with various embodiments of the present technology. The method 450 is illustrated as a set of steps or blocks 451 and 452. All or a subset of one or more of the blocks 451 and 452 can be executed in accordance with the discussion of FIGS. 1-3 above.

The method 450 begins at block 451 by providing a PCB with a frame (e.g., the PCB 201 with the frame 220 discussed above with reference to FIGS. 2A-3, or another PCB and frame of the present technology). In some embodiments, providing a PCB with a frame can include providing a PCB having an attached frame. The frame can be grown out from the PCB such that the frame is attached to the PCB during fabrication of the PCB. In other embodiments, the frame can be attached directly to the PCB and/or to mounting pads or other mounting structures disposed in or on the PCB using solder, a high-temperature adhesive, braising, diffusion bonding, or another suitable technique. The frame can be attached to a top surface or bottom surface of the PCB. Attaching the frame to the PCB can include attaching multiple frames to the PCB. Additionally, or alternatively, attaching the frame to the PCB can include attaching the frame to the PCB about critical regions of the system, such as about all or a subset of the perimeter of where memory device packages of the system are attached to the PCB.

At block 452, the method 450 continues by attaching memory device packages to the PCB. In some embodiments, attaching memory device packages to the PCB can include attaching memory device packages to the PCB before, during, or after the frame is attached to the PCB. In these and other embodiments, attaching memory device packages to the PCB can include attaching memory device packages to the PCB about or proximate the frame, such as through or within a slot (e.g., opening, void, gap, etc.) of the frame (e.g., through the openings 231 and/or 232 shown in the top surface 220a of the frame 220 in FIG. 2B) and/or on a portion of the PCB over which the frame is not positioned. In these and still other embodiments, attaching memory device packages to the PCB can include reflowing solder and subsequently allowing the system to cool. Attaching memory device packages to the PCB can further include the frame resisting or preventing warpage of the PCB as the system is subjected to heating and cooling during the assembly process.

Although the steps of the method 450 are discussed and illustrated in a particular order, the method 450 of FIG. 4 is not so limited. In other embodiments, the steps of the method 450 can be performed in a different order. In these and other embodiments, any of the steps of the method 450 can be performed before, during, and/or after any of the other steps of the method 450. Furthermore, a person skilled in the art will readily recognize that the method 450 can be altered and still remain within these and other embodiments of the present technology. For example, one or more steps of the method 450 can be omitted and/or repeated in some embodiments.

Figure 5:
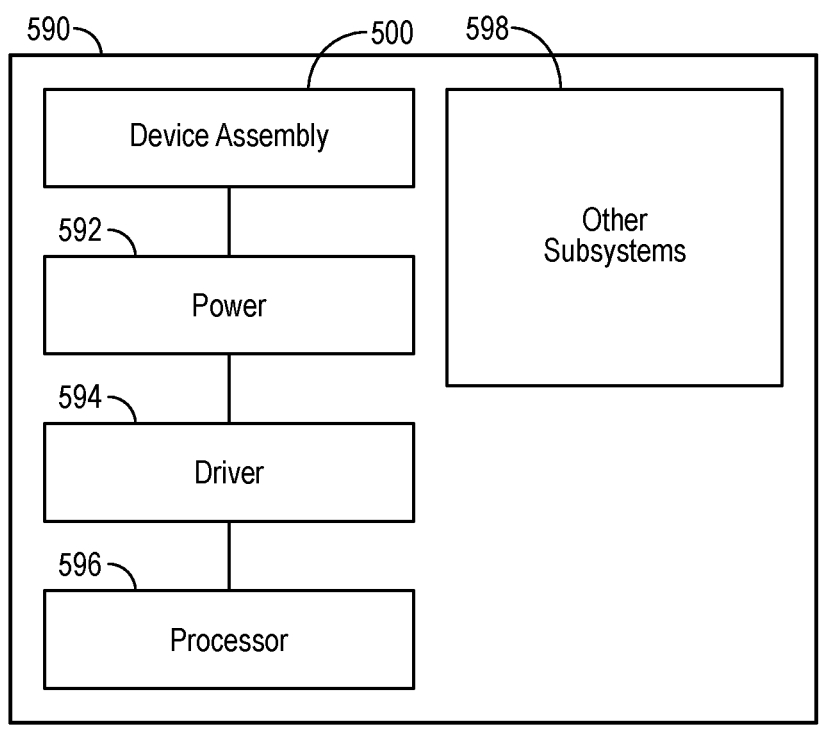
FIG. 5 is a schematic view of a system that includes a semiconductor system in accordance with embodiments of the present technology.

FIG. 5 is a schematic view of a system 590 that includes a semiconductor system in accordance with embodiments of the present technology. Any one of the foregoing semiconductor systems described above with reference to FIGS. 2A-4 can be incorporated into any of a myriad of larger and/or more complex systems, a representative example of which is system 590 shown schematically in FIG. 5. The system 590 can include a semiconductor device assembly 500, a power source 592, a driver 594, a processor 596, and/or other subsystems and components 598. The semiconductor device assembly 500 can include features generally similar to those of the semiconductor systems described above with reference to FIGS. 2A-4, and can, therefore, include one or more frames for reducing PCB warpage. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, vehicles, appliances, and other products. Components of the system 590 may be housed in a single unit or distributed over multiple, interconnected units (e.g., through a communications network). The components of the system 590 can also include remote devices and any of a wide variety of computer readable media.

C. Conclusion

As used herein, the terms "memory system" and "memory device" refer to systems and devices configured to temporarily and/or permanently store information related to various electronic devices. Accordingly, the term "memory device" can refer to a single memory die and/or to a memory package containing one or more memory dies. Similarly, the term "memory system" can refer to a system including one or more memory dies (e.g., a memory package) and/or to a system (e.g., a dual in-line memory module (DIMM) or an SSD) including one or more memory packages.

Where the context permits, singular or plural terms can also include the plural or singular term, respectively. In addition, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having" and "with" are used throughout to mean including at least the recited feature(s) such that any greater number of the same feature and/or additional types of other features are not precluded. Moreover, as used herein, the phrases "based on," "depends on," and "in response to" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. From the foregoing, it will also be appreciated that various modifications can be made without deviating from the technology. For example, various components of the technology can be further divided into subcomponents, or various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor system, comprising:
    a printed circuit board (PCB) having a first side and a second side opposite the first side;
    at least one memory device attached to the PCB at the first side of the PCB; and
    a frame structure attached to the PCB at the first side of the PCB such that (a) the frame is positioned proximate the at least one memory device at the first side of the PCB and (b) is configured to resist warpage of the PCB at least while the semiconductor system heats or cools,
    wherein the frame structure has a cross-sectional shape that includes at least a vertical column and a lateral portion that extends laterally from a top portion of the vertical column and away from the at least one memory device,
    wherein, when the frame structure and the at least one memory device are attached to the PCB at the first side of the PCB, a maximum height of the frame structure above the first side of the PCB is less than a maximum height of the at least one memory device above the first side of the PCB, wherein the maximum height of the frame structure and the maximum height of the at least one memory device are measured from the first side of the PCB along an upward direction.

2. The semiconductor system of claim 1, wherein the frame structure extends about a perimeter of the at least one memory device.

3. The semiconductor system of claim 1, wherein:
    the at least one memory device includes a first memory device and a second memory device; and
    the frame structure extends about a perimeter of the first memory device and about a perimeter of the second memory device.

4. The semiconductor system of claim 1, wherein the frame structure is composed of copper, aluminum, or a combination thereof.

5. The semiconductor system of claim 1, wherein:
    the PCB includes a mounting structure disposed in or on the first side of the PCB; and
    the frame structure is attached to the mounting structure of the PCB at the first side.

6. The semiconductor system of claim 5, wherein the mounting structure is electrically isolated from all other components of the PCB.

7. The semiconductor system of claim 5, wherein:
    the frame structure includes an elongate member; and
    at least when the frame structure is attached to the PCB at the first side of the PCB,
        the elongate member is oriented generally parallel to the first side of the PCB,
        the elongate member is attached to the mounting structure, and
        the mounting structure is disposed in or on the first side of the PCB at an end of the elongate member.

8. The semiconductor system of claim 5, wherein:
    the frame structure includes an elongate member; and
    at least when the frame structure is attached to the PCB at the first side of the PCB,
        the elongate member is oriented generally parallel to the first side of the PCB,
        the elongate member is attached to the mounting structure, and
        the mounting structure is disposed in or on the first side of the PCB at a location positioned between ends of the elongate member.

9. The semiconductor system of claim 5, wherein:
    the frame structure includes an elongate member; and
    at least when the frame structure is attached to the PCB at the first side of the PCB,
        the elongate member is oriented generally parallel to the first side of the PCB,
        the elongate member is attached to the mounting structure, and
        the mounting structure extends an entire length of the elongate member such that the elongate member is continuously attached to the mounting structure from one end of the elongate member to another end of the elongate member.

10. The semiconductor system of claim 5, wherein the mounting structure includes electrical contacts such that, when the frame structure is attached to the mounting structure, the frame structure is placed in electrical communication with other components of the PCB.

11. The semiconductor system of claim 1, wherein the frame structure is attached to the PCB at the first side of the PCB with first solder or an adhesive.

12. The semiconductor system of claim 11, wherein:
the memory device is attached to the PCB at the first side of the PCB with second solder; and
the first solder or the adhesive has a higher melting point than the second solder.

13. The semiconductor system of claim 1, wherein:
the at least one memory device includes a first surface facing the PCB and a second surface opposite the first surface; and
the frame structure does not extend over or cover any portion of the second surface.

14. The semiconductor system of claim 13, wherein the frame structure does not support a structure that is positioned on top of the frame structure and that extends over or covers any portion of the second surface.

15. The semiconductor system of claim 1, wherein:
the frame structure includes an elongate member; and
when the frame structure is attached to the PCB at the first side of the PCB:
the elongate member is oriented generally parallel to the first side of the PCB, and
at least a portion of the elongate member does not contact the first side of the PCB such that the system includes a gap between the first side of the PCB and the elongate member.

16. The semiconductor system of claim 1, wherein the frame structure does not contact the at least one memory device.

17. The semiconductor system of claim 1, wherein the frame structure includes (1) elongate and cross members connected to each other and extending laterally along a plane and (2) posts extending vertically downward from the elongate and/or cross members and connected to the PCB, wherein the elongated and the cross members are raised above the first side of the PCB such that air is permitted to pass between the elongated and the cross members of the frame structure and the first side of the PCB.

18. The semiconductor system of claim 1, wherein the frame structure extends generally along three or fewer sides of the at least one memory device such that the frame structure does not extend about an entire perimeter of the at least one memory device.

19. A printed circuit board (PCB), comprising:
a frame structure grown out of the PCB and positioned at a first side of the PCB, the frame structure having a maximum height measured from the first side of the PCB along an upward direction; and
at least one electrical pad or contact configured to interface with at least one memory device, wherein the maximum height of the frame structure configured to be less than a maximum height of the at least one memory device measured along the upward direction,
wherein the frame structure is configured to resist warpage of the PCB, including while the PCB heats or cools after or while the at least one memory device is attached to the at least one electrical pad or contact of the PCB,
wherein the frame structure has a cross-sectional shape that includes at least a vertical column and a lateral portion that extends laterally from a top portion of the vertical column and away from the at least one electrical pad or contact.

20. The PCB of claim 19, wherein the at least one electrical pad or contact is positioned at a second side of the PCB opposite the first side.

* * * * *